United States Patent
Kamata (10) Patent No.: US 10,026,780 B2
(45) Date of Patent: Jul. 17, 2018

(54) SUPERLATTICE MEMORY AND CROSSPOINT MEMORY DEVICE

(71) Applicant: KABUSHIKI KAISHA TOSHIBA, Minato-ku, Tokyo (JP)

(72) Inventor: Yoshiki Kamata, Tokyo (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/427,402

(22) Filed: Feb. 8, 2017

(65) Prior Publication Data

US 2017/0229513 A1    Aug. 10, 2017

(30) Foreign Application Priority Data

Feb. 9, 2016    (JP) .................. 2016-022984

(51) Int. Cl.
*H01L 27/24* (2006.01)
*H01L 29/15* (2006.01)
*H01L 45/00* (2006.01)

(52) U.S. Cl.
CPC ...... *H01L 27/2409* (2013.01); *H01L 27/2463* (2013.01); *H01L 29/155* (2013.01); *H01L 45/08* (2013.01); *H01L 45/1233* (2013.01); *H01L 45/144* (2013.01)

(58) Field of Classification Search
CPC ............. H01L 27/2409; H01L 27/2463; H01L 29/155; H01L 45/08; H01L 45/1233; H01L 45/144
See application file for complete search history.

(56) References Cited

U.S. PATENT DOCUMENTS

| | | | | |
|---|---|---|---|---|
| 6,531,371 B2* | 3/2003 | Hsu | .......... | G11C 11/15 257/E27.004 |
| 8,148,197 B2* | 4/2012 | Marsh | .......... | C23C 16/305 427/255.29 |
| 8,759,146 B2* | 6/2014 | Marsh | .......... | C23C 16/305 427/255.29 |
| 9,065,048 B2* | 6/2015 | Marsh | .......... | C23C 16/305 |
| 9,214,630 B2* | 12/2015 | Xiao | .......... | H01L 45/06 |
| 9,543,517 B2* | 1/2017 | Lei | .......... | H01L 45/06 |

(Continued)

FOREIGN PATENT DOCUMENTS

| JP | 2015-072977 A | 4/2015 |
|---|---|---|
| JP | 2015-115388 A | 6/2015 |
| JP | 2015-201519 A | 11/2015 |

OTHER PUBLICATIONS

T. Morikawa et al., "A Low Power Phase Change Memory Using Low Thermal Conductive Doped-$Ge_2Sb_2Te_5$ with Nano-Crystalline Structure," 2012 IEEE International Electron Devices Meeting (IEDM), Dec. 10-13, 2012, pp. 31.4.1-31.4.4.

*Primary Examiner* — Earl Taylor
(74) *Attorney, Agent, or Firm* — Foley & Lardner LLP (57) ABSTRACT

According to one embodiment, a memory includes a resistance change layer includes a first chalcogenide layer, and a second chalcogenide layer having a composition different from that of the first chalcogenide layer which are stacked alternately, and the resistance change layer having a superlattice structure, and a semiconductor layer of a first conductivity type provided on a one of main surfaces of the resistance change layer.

20 Claims, 5 Drawing Sheets

(56) References Cited

U.S. PATENT DOCUMENTS

| | | | | |
|---|---|---|---|---|
| 2004/0090823 A1* | 5/2004 | Brocklin | ............ | G11C 13/0004 365/163 |
| 2004/0141351 A1* | 7/2004 | Fricke | .................. | G11C 13/003 365/63 |
| 2004/0151024 A1* | 8/2004 | Fricke | ................ | G11C 13/0004 365/177 |
| 2004/0245517 A1* | 12/2004 | Campbell | .............. | B82Y 10/00 257/4 |
| 2011/0069533 A1* | 3/2011 | Kurosawa | ................ | G11C 8/12 365/148 |
| 2011/0155984 A1* | 6/2011 | Redaelli | .............. | H01L 27/2409 257/2 |
| 2012/0028410 A1* | 2/2012 | Marsh | ................... | C23C 16/305 438/102 |
| 2012/0171812 A1* | 7/2012 | Marsh | ................... | C23C 16/305 438/102 |
| 2014/0242748 A1* | 8/2014 | Marsh | ................... | C23C 16/305 438/102 |
| 2014/0308802 A1* | 10/2014 | Xiao | ....................... | H01L 45/06 438/483 |
| 2015/0008385 A1* | 1/2015 | Hidaka | ................ | H01L 45/144 257/2 |
| 2016/0087207 A1* | 3/2016 | Lei | ......................... | H01L 45/06 438/382 |
| 2016/0233420 A1* | 8/2016 | Troyan | ................. | H01L 45/144 |
| 2016/0336378 A1* | 11/2016 | Ohba | ................ | G11C 13/0007 |
| 2017/0069839 A1* | 3/2017 | Troyan | ................ | H01L 45/1253 |
| 2017/0229465 A1* | 8/2017 | Luan | ................ | H01L 21/28518 |
| 2017/0229513 A1* | 8/2017 | Kamata | .............. | H01L 27/2409 |
| 2017/0229645 A1* | 8/2017 | Kamata | ................ | H01L 45/144 |

\* cited by examiner

SUPERLATTICE MEMORY AND CROSSPOINT MEMORY DEVICE

CROSS-REFERENCE TO RELATED APPLICATIONS

This application is based upon and claims the benefit of priority from Japanese Patent Application No. 2016-022984, filed Feb. 9, 2016, the entire contents of which are incorporated herein by reference.

FIELD

Embodiments described herein relate generally to a superlattice memory device, and a crosspoint memory device using the superlattice memory device.

BACKGROUND

Recently, a superlattice memory cell provided with layered crystal (GeTe/$Sb_2Te_3$) in which a GeTe layer and an $Sb_2Te_3$ layer are alternately stacked between two electrodes has been attracting attention. In the superlattice memory cell, by the movement of Ge atoms in the layered crystal, the resistance can be varied.

In a crosspoint memory device using this type of memory cell, a pn junction diode for preventing erroneous selection of unselected cells must be connected to either of the electrodes of the memory cell. For this reason, a film thickness is increased by the existence of the diode. Further, the element characteristics may be degraded by the property variation of the diode.

DETAILED DESCRIPTION

In general, according to one embodiment, a memory comprises: a resistance change layer comprising a first chalcogenide layer and a second chalcogenide layer having a composition different from the first chalcogenide layer which are stacked alternately, and the resistance change layer having a superlattice structure; and a semiconductor layer of a first conductivity type provided on a one of main surfaces of the resistance change layer.

Hereinafter, a crosspoint memory device of the present embodiment will be described with reference to the accompanying drawings.

(First Embodiment)

Figure 1:
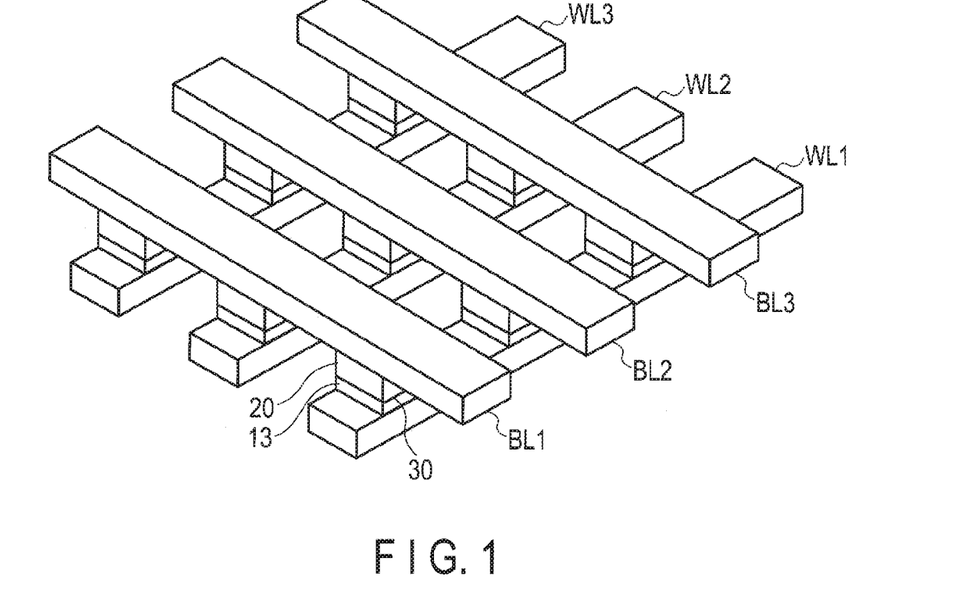
FIG. 1 is a perspective view showing a schematic structure of a crosspoint memory device according to a first embodiment.
Figure 2:
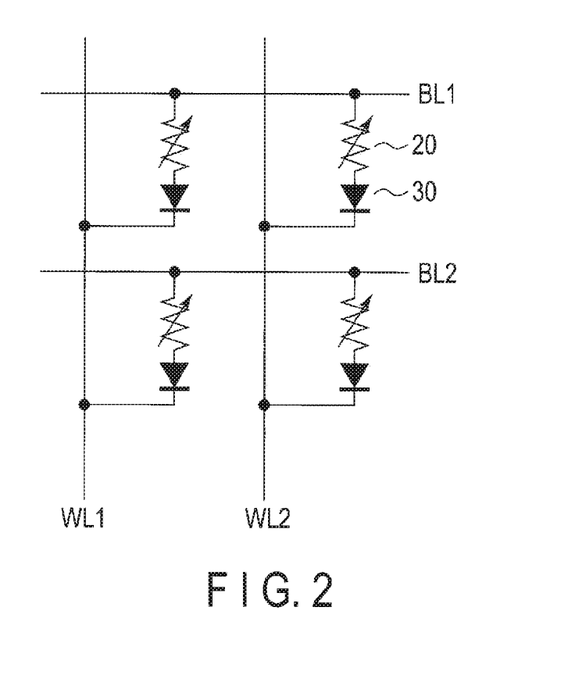
FIG. 2 is an equivalent circuit diagram showing a circuit structure of the crosspoint memory device according to the first embodiment.

FIGS. 1 and 2 are illustrations for explaining a schematic structure of a crosspoint memory device according to a first embodiment. FIG. 1 is a perspective view, and FIG. 2 is an equivalent circuit diagram of the crosspoint memory device.

A plurality of bit lines (first lines: BL [BL1, BL2, . . . ]) are arranged parallel to each other. A plurality of word lines (second lines: WL [WL1, WL2, . . . ]) are arranged parallel to each other such that they are orthogonal to the bit lines BL. Further, in each intersection of the bit line BL and the word line WL, a superlattice memory in which a superlattice memory cell 20 and a diode 30 are connected in series is provided.

Note that in FIG. 1, in order to make the structure easier to understand, an interlayer insulating film, etc., is not illustrated. Further, reference number 13 in the drawing shows an n-type semiconductor layer for forming the diode 30.

Figure 3A:
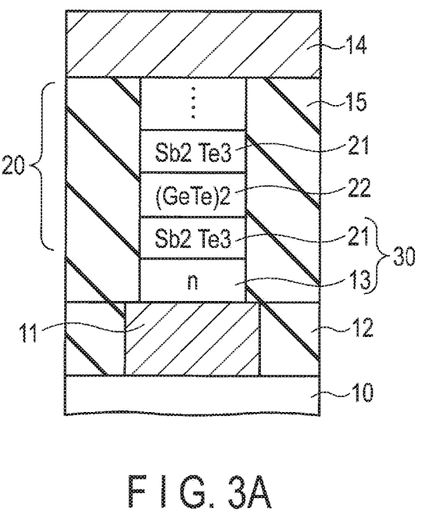
FIG. 3A is a cross-sectional view showing an element structure of a superlattice memory for use in the crosspoint memory device shown in FIG. 1.

FIG. 3A is a cross-sectional view showing an element structure of the superlattice memory constituted of the superlattice memory cell 20 and the diode 30.

A bottom electrode (a first electrode) 11 is provided on a substrate 10. The bottom electrode 11 constitutes the word line WL in FIG. 1, and extends in directions of the front and back of the drawing. Side portions of the bottom electrode 11 are buried with an insulating film 12 of $SiO_2$, for example. Further, instead of employing the bottom electrode 11 directly as the word line WL, the bottom electrode 11 may be provided on the word line WL. Furthermore, the substrate 10 is, for example, a semiconductor substrate, and the semiconductor substrate is provided with a CMOS circuit, etc., for writing data in a memory and reading data therefrom.

The diode 30 and the superlattice memory cell 20 of the resistance-change-type are provided on the bottom electrode 11 like a pillar.

More specifically, an n-type Si layer (a semiconductor layer) 13 as a first conductivity type layer is provided on the bottom electrode 11 by sputtering or the CVD method, and the resistance-change-type superlattice memory cell 20 is provided on the layer 13. The n-type semiconductor layer 13 is hydrogenated amorphous silicon doped with phosphorus (P). Instead of using amorphous silicon, polysilicon formed at a low temperature can be used.

The superlattice memory cell 20 has a superlattice structure obtained by alternately stacking an $Sb_2Te_3$ layer (a first chalcogenide layer) 21 and a GeTe layer (a second chalcogenide layer) 22 by sputtering, the CVD method, ALD method, MBE method, or the like. Here, the number of $Sb_2Te_3$ layers 21 and GeTe layers 22 for structuring the superlattice memory cell 20 can be changed as appropriate according to the specification required. Further, an undermost layer of the superlattice memory cell 20 is the $Sb_2Te_3$ layer 21.

Note that the n-type Si layer 13, the $Sb_2Te_3$ layer 21, and the GeTe layer 22 are processed into a pillar-like form by selective etching by an RIE method or the like, after they have been formed on the electrode 11 and the insulating film 12 by the sputtering, etc.

The operation principle of the superlattice memory cell 20 is that a position of the Ge atom is changed in a crystalline structure depending on a voltage or current to be applied. Further, as compared to a phase-change memory cell using a phase-change material such as $Ge_2Sb_2Te_3$, switching at a low-current is enabled, which is effective in reducing power consumption.

Figure 4:
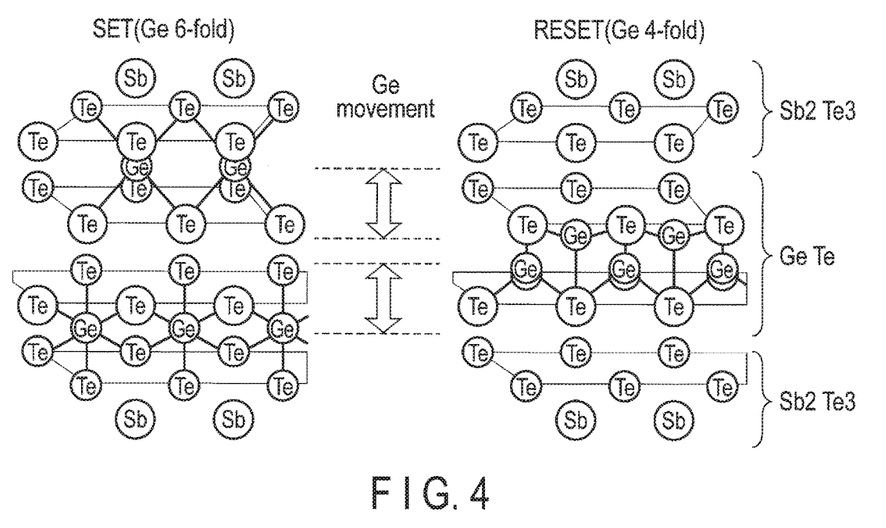
FIG. 4 is a schematic diagram for explaining a set/reset operation in a superlattice memory cell.

As shown in FIG. 4, by movement of the Ge atoms, the superlattice memory cell 20 can be either in a write (set) state or an erasure (reset) state. More specifically, by the electric energy input to the memory cell, Ge atoms which exist within a GeTe layer are diffused to the interface between the GeTe layer and an $Sb_2Te_3$ layer, thereby forming a structure similar to one in a crystallized state as a crystal having anisotropy (write state). In this case, as compared to a structure before the Ge atoms are diffused, the electrical resistance is lowered.

Also, by returning the above-mentioned Ge atoms stored in the interface to the original GeTe layer by using the electric energy input to the memory cell, it is possible to restore the structure to a structure similar to an amorphous structure having the electrical resistance equivalent to that of a random structure conventionally called amorphous (erasure state). In this case, the electrical resistance is increased.

As described above, by switching the position of the Ge atoms in the crystalline structure, thereby changing the resistance, the memory functions as the resistance-change-type memory.

A top electrode (a second electrode) 14 is provided on the superlattice memory cell 20. The top electrode 14 constitutes the bit line BL in FIG. 1, and extends in directions of the right and left of the drawing in FIG. 3A. Further, instead of employing the top electrode 14 directly as the bit line BL, the bit line BL may be provided on the top electrode 14.

In order to bury spaces between the respective pillars formed of the n-type Si layer 13 and the superlattice memory cell 20, an interlayer insulating film 15 formed of $SiO_2$, for example, is provided, so that the surface is planarized. Further, the top electrode 14 is provided to extend over the interlayer insulating film 15 so that upper surfaces of the superlattice memory cells 20 are connected.

In the present embodiment, since the n-type Si layer 13 is formed on the bottom electrode 11, the n-type Si layer 13 is to be formed between the $Sb_2Te_3$ layer 21, which is the undermost layer of the superlattice memory cell 20, and the bottom electrode 11. Here, since the $Sb_2Te_3$ layer 21, which is the material of the superlattice memory cell 20, is a p-type semiconductor as a second conductivity type layer, the diode 30 which is thin is formed by the n-type Si layer 13 and the $Sb_2Te_3$ layer 21 because a pn junction is achieved at the interface. That is, the diode 30 is formed in series with the superlattice memory cell 20 between the word line WL and the bit line BL. As described above, if a pn junction is formed by using different materials in which one material will not act as a dopant material in terms of the other material, the diode 30 which has a small film thickness and a small property variation can be formed.

Figure 3B:
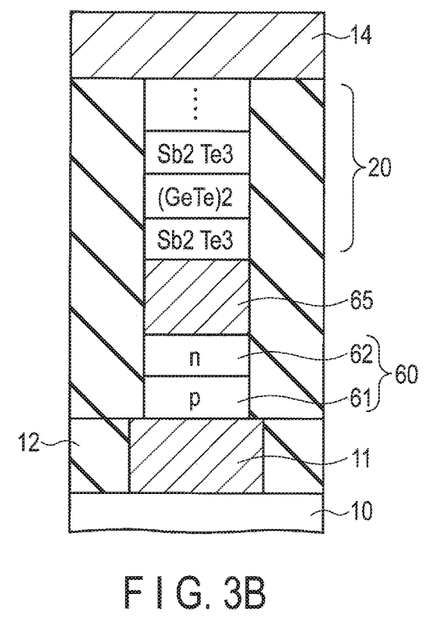
FIG. 3B is a cross-sectional view showing an element structure of a superlattice memory based on a conventional idea.

For comparison, FIG. 3B shows the structure of a superlattice memory based on a conventional idea. In order to connect a diode in series with the superlattice memory 20, a pn junction diode 60 constituted of an n-type semiconductor layer 61 and a p-type semiconductor layer 62 must be connected to the memory cell 20 via a metal electrode 65. For this reason, the film thickness is increased by the existence of the diode 60. Further, the element characteristics are degraded by the property variation of the diode 60.

According to the present embodiment described above, by connecting a series circuit constituted of the superlattice memory cell 20 and the diode 30 to each intersection of the bit line BL and the word line WL, a crosspoint memory device can be produced.

Further, in this case, since the diode 30 can be formed by adding only one layer of the n-type Si layer 13, a process for forming a diode can be simplified. Further, by using a part of the superlattice memory 20 as a part of the diode 30, it is possible to produce a diode whose cell thickness is small, and property variation is small. Accordingly, as compared to a case where the n-type semiconductor layer and the p-type semiconductor layer are stacked for the pn junction, the diode 30 can be thinned, and the variation can be reduced. That is, as compared to a case of separately producing a diode, the thickness of a memory cell including a diode can be reduced, and thus, the structure of the present embodiment is suitable for achieving a highly integrated three-dimensional memory, etc.

Further, as in the present embodiment, by forming a pn junction with different materials in which one material will not act as a dopant material in terms of the other material, a diode having a small variation can be produced. Furthermore, by producing the diode 30 with the formation of only the n-type Si layer 13, it is clear that the variation of the diode is reduced as compared to a case of forming both the p-type layer and the n-type layer.

(Second Embodiment)

Figure 5:
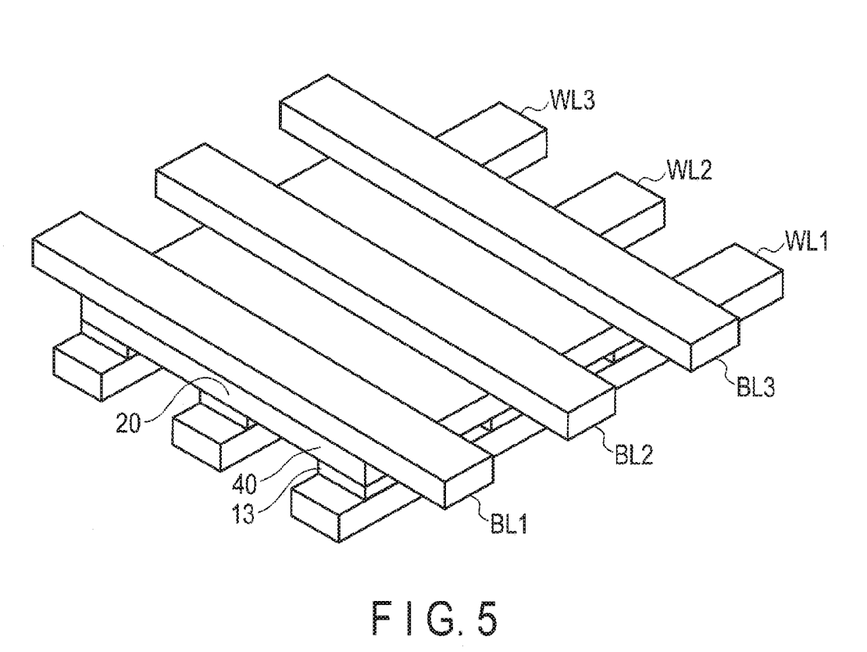
FIG. 5 is a perspective view showing a schematic structure of a crosspoint memory device according to a second embodiment.
Figure 6:
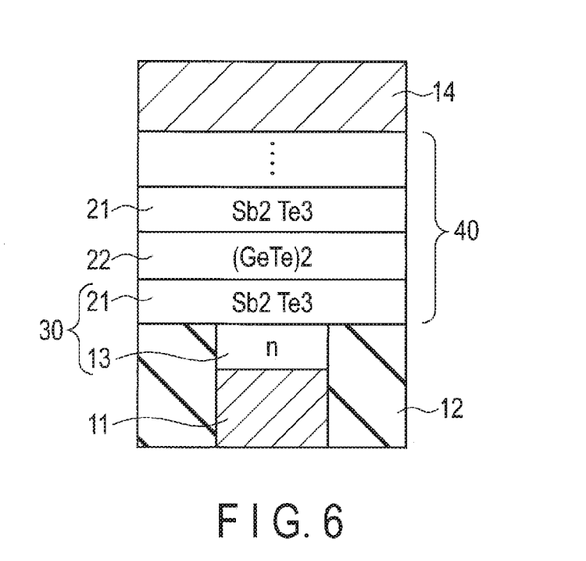
FIG. 6 is a cross-sectional view showing an element structure of a superlattice memory for use in the crosspoint memory device shown in FIG. 5.

FIGS. 5 and 6 are illustrations for explaining a crosspoint memory device according to a second embodiment. FIG. 5 is a perspective view showing a schematic structure of the crosspoint memory device, and FIG. 6 is a cross-sectional view showing an element structure of a superlattice memory. Note that the same portions as those of FIGS. 1 and 3A will be given the same reference numbers, and detailed explanations of them will be omitted.

The point in which the present embodiment is different from the first embodiment described above is that each of layers 21 and 22 which constitute a superlattice memory cell 20 is not processed like a pillar, but is formed to be continuous over a plurality of cells. That is, a superlattice structure portion 40 constituted of an $Sb_2Te_3$ layer 21 and a GeTe layer 22 is formed by only depositing the layers by sputtering, etc., and no etching processing such as the RIE method is performed.

In such a structure, with respect to the superlattice structure portion 40 constituted of the $Sb_2Te_3$ layer 21 and the GeTe layer 22, an intersection portion of a bit line BL and a word line WL substantially functions as the superlattice memory cell 20. That is, even if the superlattice structure portion 40 is continuous between adjacent cells, as long as the adjacent cells are not too close to each other, the cells can be separated from each other, and the present embodiment can exhibit a structure similar to the equivalent circuit shown in FIG. 2.

Accordingly, a crosspoint memory device can be produced as in the first embodiment described above, and an advantage similar to that of the first embodiment can be obtained. Also, in the present embodiment, since an etching process of the superlattice structure portion 40 constituted of the $Sb_2Te_3$ layer 21 and the GeTe layer 22 becomes unnecessary, there is also an advantage that a manufacturing process can be simplified.

(Third Embodiment)

Figure 7:
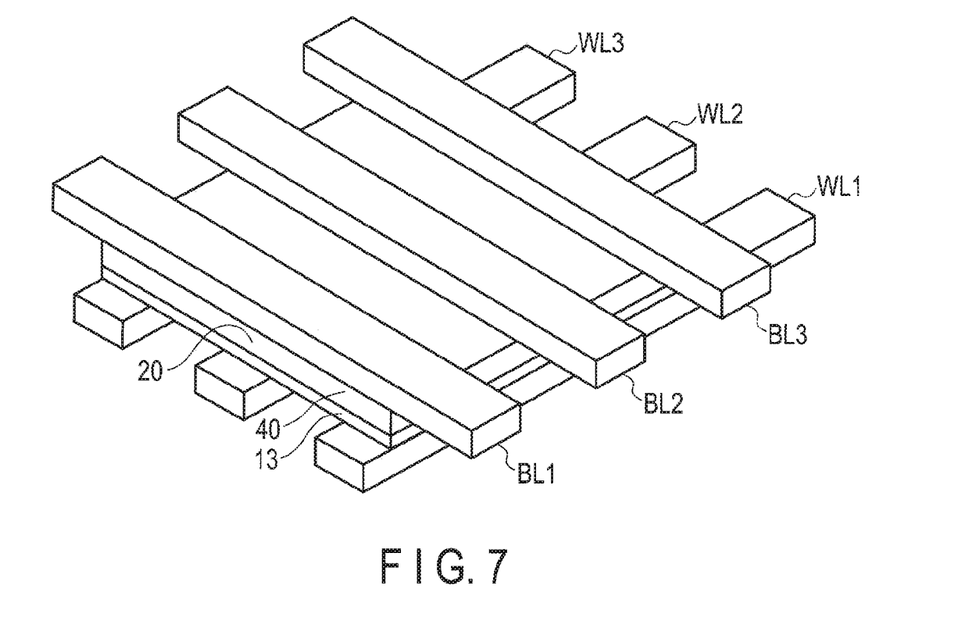
FIG. 7 is a perspective view showing a schematic structure of a crosspoint memory device according to a third embodiment.
Figure 8:
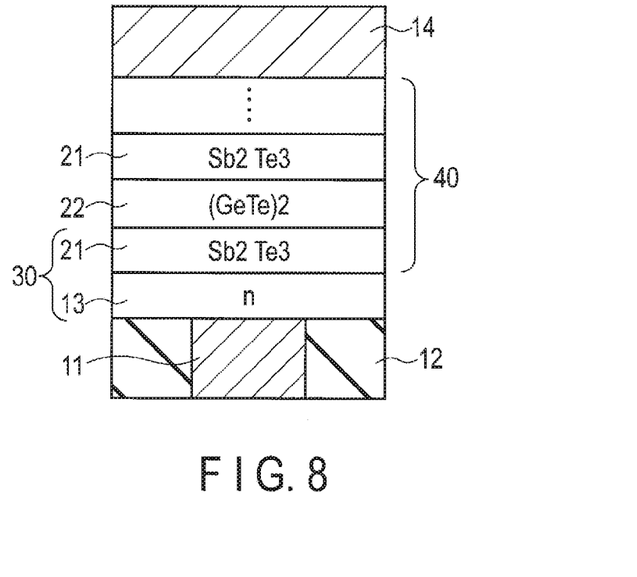
FIG. 8 is a cross-sectional view showing an element structure of a superlattice memory for use in the crosspoint memory device shown in FIG. 7.

FIGS. 7 and 8 are illustrations for explaining a crosspoint memory device according to a third embodiment. FIG. 7 is a perspective view showing a schematic structure of the crosspoint memory device, and FIG. 8 is a cross-sectional view showing an element structure of a superlattice memory. Note that the same portions as those of FIGS. 1 and 3A will be given the same reference numbers, and detailed explanations of them will be omitted.

The point in which the present embodiment is different from the first embodiment described above is that each of layers 21 and 22 which constitute a superlattice memory cell 20, and an n-type Si layer 13 are not processed like a pillar, but are formed to be continuous over a plurality of cells. That is, a superlattice structure portion 40 constituted of an $Sb_2Te_3$ layer 21 and a GeTe layer 22 and the n-type Si layer 13 are only formed by sputtering, etc., and no etching processing such as the RIE method is performed.

In such a structure, with respect to the superlattice structure portion 40 constituted of the $Sb_2Te_3$ layer 21 and the GeTe layer 22, an intersection portion of a bit line BL and a word line WL substantially functions as the superlattice memory cell 20. That is, even if the n-type Si layer 13 and the superlattice structure portion 40 are continuous between adjacent cells, as long as the adjacent cells are not too close to each other, the cells can be separated from each other, and the present embodiment can exhibit a structure similar to the equivalent circuit shown in FIG. 2.

Accordingly, a crosspoint memory device can be produced as in the first embodiment described above, and an advantage similar to that of the first embodiment can be obtained. Also, in the present embodiment, since an etching process of the superlattice structure portion 40 constituted of the $Sb_2Te_3$ layer 21 and the GeTe layer 22, and the n-type Si layer 13 becomes unnecessary, there is also an advantage that a manufacturing process can further be simplified.

(Modification)

It should be noted that each of the embodiments is not limited to the above.

Although an n-type silicon layer is used in the present embodiment as the n-type semiconductor layer, an n-type poly-Ge layer or an n-type oxide semiconductor such as InGaZnO can be used instead. Also, n-type $Bi_2Te_3$ can be used. Further, a metal layer which forms a Schottky barrier junction may alternatively be used. In other words, the material may be any as long as it directly contacts the superlattice structure portion and can form a diode.

Figure 9:
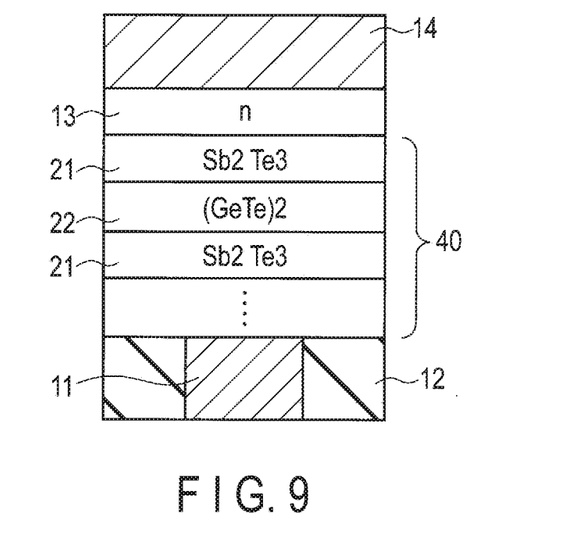
FIG. 9 is a cross-sectional view showing a modification of an element structure of the superlattice memory.

Although the n-type semiconductor layer is made to contact the lower side of the superlattice structure portion in the present embodiment, as shown in FIG. 9, the n-type semiconductor layer 13 may be made to contact the upper side of the superlattice structure portion 40. Further, the semiconductor layer which is made to contact the superlattice structure portion is not necessarily limited to the n-type semiconductor layer. If the $Sb_2Te_3$ layer which forms the superlattice structure portion is the n-type semiconductor layer (for example, mixed crystal of $Bi_2Te_3$ layer and another material), the layer which is made to contact the superlattice structure portion may be a p-type semiconductor layer.

Figure 10:
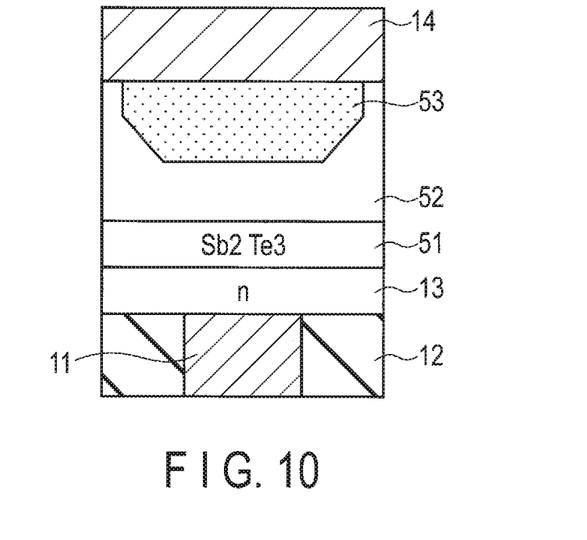
FIG. 10 is a cross-sectional view showing an example applied to a phase-change memory.

Also, the memory cell is not necessarily limited to the superlattice structure, and may be one which uses a phase change material such as $Ge_2Sb_2Te_5$. For example, the concept as described above can be applied to a phase-change memory shown in FIG. 10. The phase-change memory changes the resistance by switching the crystallinity of an element 53 between amorphous and crystalline. In the drawing, 51 denotes the $Sb_2Te_3$ layer, and 53 denotes a portion (an amorphous dome) which is a crystallinity transition portion in a $Ge_2Sb_2Te_5$ alloy cell 52.

Also, the superlattice memory is not necessarily limited to a two-dimensionally arranged structure. The two-dimensional superlattice memory can be applied to a three-dimensional memory formed by arranging the superlattice memory three-dimensionally.

The layers which form the superlattice structure portion are not limited to stacked layers of the $Sb_2Te_3$ layer and the GeTe layer, and it suffices that layered crystal including Ge and a chalcogen element, and layered crystal including Sb and a chalcogen element are stacked. In short, it suffices that the superlattice structure portion is formed by alternately stacking a first chalcogenide layer, and a second chalcogenide layer having a composition different from that of the first chalcogenide layer.

Alternatively, as the layers which constitute the superlattice structure portion, layers such as $(GeTe)_n(Sb_2Te_3)_m$, those in which at least a part of Ge in the aforementioned structure is replaced by C, Si, Sn, or Pb, those in which at least a part of Sb in the aforementioned structure is replaced by Bi, As, P, or N, or those in which at least a part of Te in the aforementioned structure is replaced by Se, S, or O can be used. That is, homologous-based $[AB)_n(C_2D_3)_m$, where A, B, C, and D are elements, and n, m are numbers] compound single crystal or polycrystal can be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a resistance change layer comprising a first chalcogenide layer and a second chalcogenide layer having a composition different from the first chalcogenide layer which are stacked alternately, and the resistance change layer having a superlattice structure, and
a semiconductor layer of a first conductivity type provided on one of main surfaces of the resistance change layer, wherein
the first chalcogenide layer is of a second conductivity type, and
the first chalcogenide layer directly contacts the semiconductor layer.

2. The device of claim 1, wherein:
the first chalcogenide layer includes Sb, and the second chalcogenide layer includes Ge.

3. The device of claim 1, wherein:
the first chalcogenide layer is an $Sb_2Te_3$ layer, and the second chalcogenide layer is a GeTe layer; and
the $Sb_2Te_3$ layer is provided on the semiconductor layer.

4. The device of claim 1, wherein the semiconductor layer is amorphous silicon, poly-Ge, or InGaZnO.

5. The device of claim 1, wherein:
the semiconductor layer is of an n-type, and the first chalcogenide layer is of a p-type; and
a pn junction diode is constituted of the semiconductor layer and the first chalcogenide layer.

6. The device of claim 1, wherein the resistance change layer and the semiconductor layer are provided in a form of a pillar.

7. A memory device comprising:
 a resistance change layer comprising a first chalcogenide layer and a second chalcogenide layer having a composition different from the first chalcogenide layer which are stacked alternately, and the resistance change layer having a superlattice structure;
 a first electrode provided at a main surface of the resistance change layer on one side with respect to a layer-stacking direction;
 a second electrode provided at another main surface of the resistance change layer on the other side with respect to the layer-stacking direction; and
 a semiconductor layer of a first conductivity type provided between the first or the second electrode and the resistance change layer, wherein
 the first chaleogenide layer is of a second conductivity type, and
 the first chalcogenide layer directly contacts the semiconductor layer.

8. The device of claim 7, wherein:
 the first chalcogenide layer includes Sb, and the second chalcogenide layer includes Ge.

9. The device of claim 7, wherein:
 the first chalcogenide layer is an $Sb_2Te_3$ layer, and the second chalcogenide layer is a GeTe layer; and
 the $Sb_2Te_3$ layer is provided on the semiconductor layer.

10. The device of claim 7, wherein the semiconductor layer is amorphous silicon, poly-Ge, or InGaZnO.

11. The device of claim 7, wherein:
 the semiconductor layer is of an n-type, and the first chalcogenide layer is of a p-type; and
 a pn junction diode is constituted of the semiconductor layer and the first chalcogenide layer.

12. The device of claim 7, wherein the resistance change layer and the semiconductor layer are provided like a pillar.

13. A memory device comprising:
 a plurality of first lines;
 a plurality of second lines extending in a direction crossing to the first lines;
 a superlattice memory cell arranged at each intersection of the first line and the second line, the superlattice memory cell comprising a first chalcogenide layer, and a second chalcogenide layer having a composition different from the first chalcogenide layer which are stacked alternately; and
 a semiconductor layer of a first conductivity type provided between the first line or the second line and the superlattice memory cell, wherein
 the first chalcogenide layer is of a second conductivity type and
 the first chalcogenide layer directly contacts the semiconductor layer.

14. The device of claim 13, wherein:
 the first chalcogenide layer includes Sb, and the second chalcogenide layer includes Ge.

15. The device of claim 13, wherein:
 the first chalcogenide layer is an $Sb_2Te_3$ layer, and the second chalcogenide layer is a GeTe layer; and
 the $Sb_2Te_3$ layer is provided on the semiconductor layer.

16. The device of claim 13, wherein the semiconductor layer is amorphous silicon, poly-Ge, or InGaZnO.

17. The device of claim 13, wherein:
 the semiconductor layer is of an n-type, and the first chalcogenide layer is of a p-type; and
 a pn junction diode is constituted of the semiconductor layer and the first chalcogenide layer.

18. The device of claim 13, wherein the first chalcogenide layer, the second chalcogenide layer, and the semiconductor layer are provided in a form of a pillar.

19. The device of claim 13, wherein the first chalcogenide layer and the second chalcogenide layer are provided to be continuous over the superlattice memory cells, and the semiconductor layer is provided in a form of a pillar.

20. The device of claim 13, wherein the first chalcogenide layer, the second chalcogenide layer, and the semiconductor layer are provided to be continuous over the superlattice memory cells.

* * * * *